US007013422B2

(12) United States Patent
McCarley et al.

(10) Patent No.: US 7,013,422 B2
(45) Date of Patent: Mar. 14, 2006

(54) NOISE REMOVAL IN MULTIBYTE TEXT ENCODINGS USING STATISTICAL MODELS

(75) Inventors: Jeffrey S. McCarley, Bedford Hills, NY (US); Wei-Jing Zhu, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 630 days.

(21) Appl. No.: 09/882,006

(22) Filed: Jun. 15, 2001

(65) Prior Publication Data

US 2003/0070137 A1    Apr. 10, 2003

(51) Int. Cl.
 *H03M 13/03* (2006.01)
(52) U.S. Cl. ............... 714/794; 714/811; 714/807; 714/809; 400/110; 400/484; D18/25
(58) Field of Classification Search ............... 714/794, 714/811, 807, 809; 400/110, 484; D18/25
See application file for complete search history.

(56) References Cited

U.S. PATENT DOCUMENTS

| | | | |
|---|---|---|---|
| 4,975,916 A | | 12/1990 | Miracle et al. |
| 5,197,810 A | * | 3/1993 | Zhang et al. ............... 400/110 |
| 5,226,148 A | | 7/1993 | Littlewood |
| 5,309,358 A | | 5/1994 | Andrews et al. |
| 5,784,069 A | | 7/1998 | Daniels et al. |
| 5,784,071 A | | 7/1998 | Tang et al. |
| 5,793,381 A | | 8/1998 | Edberg et al. |
| 5,898,385 A | * | 4/1999 | Makino ................ 340/7.43 |
| 5,940,836 A | | 8/1999 | Fukushima |
| 5,964,885 A | | 10/1999 | Little et al. |
| 6,018,304 A | | 1/2000 | Bessios |
| 6,189,006 B1 | | 2/2001 | Fukushima |

OTHER PUBLICATIONS

LeGland et al. 'Recursive estimation in hidden Markov models'; Dec. 10-12, 1997; IEEE; pp.: 3468-3473 vol. 4.*
Tugnait 'Adaptive estimation and identification for discrete systems with Markov jump parameters;' Oct. 1982; IEEE; 1054-106 vol.: 27.*
"Validation of Double-Byte Character Sets Text for Prompting in a Language-Sensitive Editing System", IBM Technical Disclosure Bulletin, vol. 37, Publication No. 11, Nov. 1994, pp. 11-14.
"Validation of Double-Byte Character Sets Text for Tokenization in a Language Sensitive Editing System", IBM Technical Disclosure Bulletin, vol. 36, Publication No. 68, Jun. 1993, pp. 443-446.
Peters, "Resists Join the Sub-λ Revolution", Semiconductor International, Sep. 1999.
PCT International Search Report.

* cited by examiner

*Primary Examiner*—Guy J. Lamarre
(74) *Attorney, Agent, or Firm*—F. Chau & Associates, LLC

(57) ABSTRACT

Disclosed is a method of validating a byte sequence having a plurality of states, the method comprising designating one or more noise states from among the plurality of states; generating a most probable state sequence for the byte sequence; utilizing said state sequence to identify all noise in the byte sequence; and localizing said noise in said noise states. Once localized, the noise may be deleted from the byte sequence.

15 Claims, 2 Drawing Sheets

NOISE REMOVAL IN MULTIBYTE TEXT ENCODINGS USING STATISTICAL MODELS

STATEMENT REGARDING FEDERALLY FUNDED RESEARCH OR DEVELOPMENT

This work was supported under a DARPA government contract, SPAWAR contract No. N66001-99-2-8916.

BACKGROUND OF THE INVENTION

1. Field of the Invention

This invention relates to the validation of character code sequences.

2. Discussion of the Related Art

Double-byte character encoding is commonly used for a number of purposes, among them encoding complex character sets such as GB 2312-80, the simplified Chinese characters used in mainland China. GB 2312-80 contains 7,445 Chinese characters represented as a pair of bytes wherein each byte is a number from 161 to 254. This allows the mixing of the Chinese characters with conventional ASCII text, which is represented by byte values in the range of 0 to 127. Technically, the simultaneous representation of GB 2312-80 with ASCII is called EUC-CN encoding, though we refer to it as GB 2312-80 throughout this specification for simplicity. This necessarily implies that bytes in the range of 161 to 254 must come in pairs and any string of such characters must have an even number of such bytes in a row between any two single-byte ASCII characters. Byte values in the range of 128 to 160 are invalid for GB 2312-80. Despite these rules, invalid characters and sequences, collectively referred to as "noise", is found to occur in 5% to 10% of Chinese webpages and newswire texts. The origins of this noise is obscure.

Applications currently available for the processing of double-byte encodings are inadequate to cope with noise. For example, GB to unicode converters simply crash on the first invalid byte sequence and all information following the noise is lost.

Repairing such noise presents a problem of ambiguity. For example, consider the case of a nine-byte sequence of GB 2312-80 characters, all in the range of 161–254—which "half character" is the noise to be discarded? Discarding any one of the bytes will likely leave four perfectly valid Chinese characters, but in an incomprehensible sequence. In probability, only one of the bytes may be discarded so as to produce an intelligible string of characters.

What is needed is a method of validating strings of double-byte characters to detect and remove such noise.

SUMMARY OF THE INVENTION

Disclosed is a method of validating a byte sequence having a plurality of states, the method comprising designating one or more noise states from among the plurality of states, generating a most probable state sequence for the byte sequence, utilizing said state sequence to identify all noise in the byte sequence, and localizing said noise in said noise states.

In another aspect of the invention, the noise is then deleted from the byte sequence.

In another aspect of the invention, the noise state is an ASCII state.

In another aspect of the invention said generating of a most probable state sequence comprises calculating $P(X_0 \ldots X_n | S_0 \ldots S_n)$, representing the conditional probabilities of said byte sequence given a state sequence.

In another aspect of the invention, said calculating $P(X_0 \ldots X_n | S_0 \ldots S_n)$ comprises assigning a state label $S_i$ to each $i^{th}$ byte $X_i$ of the byte sequence so as to maximize the equation:

$$P(X_0 \ldots X_N | S_0 \ldots S_N) = P_0(S_0)\left[\prod_{i=1}^{N} \overline{A}(S_i | S_{i-1})\right]\left[\prod_{i=0}^{N} \overline{B}(X_i | S_i)\right]$$

wherein $P_0(S_0)$ is the initial distribution of states; $\overline{A}(S_i | S_{i-1})$ is a "state-to-state" transition matrix; and $\overline{B}(X_i | S_i)$ is a "byte-from-state" matrix of the probabilities of generating a byte value $X_i$ given a state $S_i$.

In another aspect of the invention, $$\overline{A}(S_i | S_{i-1}) = \begin{bmatrix} p(S^1_{i-1} \to S^1_i) & \cdots & p(S^1_{i-1} \to S^\sigma_i) \\ \vdots & \ddots & \vdots \\ p(S^\sigma_{i-1} \to S^1_i) & \cdots & p(S^\sigma_{i-1} \to S^\sigma_i) \end{bmatrix}$$

where each $p(S_{i-1} \to S_i)$ is the probability that a particular $S_i$ state immediately follows an $S_{i-1}$ state in a valid byte sequence having $\sigma$ states.

In another aspect of the invention, $$\overline{A}(S_i | S_{i-1}) = \begin{bmatrix} p(A \to A) & p(A \to GB1) & p(A \to GB2) \\ p(GB1 \to A) & p(GB1 \to GB1) & p(GB1 \to GB2) \\ p(GB2 \to A) & p(GB2 \to GB1) & p(GB2 \to GB2) \end{bmatrix}$$

where each $p(S_{i-1} \to S_i)$ is the probability that a particular $S_i$ state immediately follows an $S_{i-1}$ state in a valid byte sequence having three states.

In another aspect of the invention, $$\overline{A}(S_i | S_{i-1}) = \begin{bmatrix} 0.995157 & 0.004843 & 0 \\ 0 & 0 & 1 \\ 0.037944 & 0.962056 & 0 \end{bmatrix}$$

and said valid byte sequence is valid text in the GB 2312-80 character set.

In another aspect of the invention, $$\overline{B}(X_i|S_i) = \begin{bmatrix} h_1(X_i=1) & \cdots & h_s(X_i=1) & \cdots & h_\sigma(X_i=1) \\ \vdots & \ddots & \vdots & & \vdots \\ h_1(X_i=x_1) & & h_s(X_i=x_1) & & h_\sigma(X_i=x_1) \\ h_1(X_i=x_1+1) & & \varepsilon_1(X_i=x_1+1) & & h_\sigma(X_i=x_1+1) \\ \vdots & & \vdots & & \vdots \\ h_1(X_i=x_r) & & \varepsilon_1(X_i=x_r) & & h_\sigma(X_i=x_r) \\ h_1(X_i=x_r+1) & & \varepsilon_r(X_i=x_r+1) & & h_\sigma(X_i=x_r) \\ \vdots & & \vdots & \ddots & \vdots \\ h_1(X_i=x_r=255) & & \varepsilon_r(X_i=x_r=255) & & h_\sigma(X_i=255) \end{bmatrix}$$

where $h_s(X_i)$ are histogram functions of the σ states and $\varepsilon_j(X_i)$ are probabilities of associating noise with the noise state for bytes within r+1 ranges of byte values $X_i$.

In another aspect of the invention, $$\overline{B}(X_i|S_i) = \begin{bmatrix} h_A(X_i=1) & 0 & 0 \\ \vdots & \vdots & \vdots \\ h_A(X_i=127) & 0 & 0 \\ \varepsilon_1(X_i=128) & 0 & 0 \\ \vdots & \vdots & \vdots \\ \varepsilon_1(X_i=160) & 0 & 0 \\ \varepsilon_2(X_i=161) & h_1(X_i=161) & h_2(X_i=161) \\ \vdots & \vdots & \vdots \\ \varepsilon_2(X_i=254) & h_1(X_i=254) & h_2(X_i=254) \\ \varepsilon_3(X_i=255) & 0 & 0 \end{bmatrix}$$

where $h_s(X_i)$ are histogram functions of the states, and $\varepsilon_j(X_i)$ are probabilities of associating noise with the ASCII state within a plurality of $X_i$ ranges for a three-state byte sequence.

Another aspect of the invention further comprises, providing a valid three-state byte sequence having an ASCII state and comprising valid ASCII and two-byte characters, computing an ASCII histogram $h_A(X_i)$ by a method comprising sampling valid ASCII text so as to measure the frequency of occurrence of each byte value; computing an unnormalized histogram of said sampling over the ASCII range of $X_i$; and normalizing said unnormalized histogram such that the entire column of the matrix containing said ASCII histogram sums to 1, and computing a first-byte histogram $h_1(X_i)$ by sampling valid two-byte text and computing the unnormalized first-byte histogram over the odd bytes, and normalizing said first-byte histogram such that the entire column of the matrix containing said first-byte histogram sums to 1, and computing a second-byte histogram $h_2(X_i)$ by sampling valid two-byte text and computing the unnormalized second-byte histogram over the odd bytes, and normalizing said second-byte histogram such that the entire column of the matrix containing said second-byte histogram sums to 1.

Disclosed is a program storage device readable by machine, tangibly embodying a program of instructions executable by the machine to perform method steps for validating a byte sequence having a plurality of states, said method comprising designating one or more noise states from among the plurality of states generating a most probable state sequence for the byte sequence, utilizing said state sequence to identify all noise in the byte sequence, and localizing said noise in said noise states.

In another aspect of the device, said localizing of said noise in said noise states comprises examining each byte in said byte sequence that does not correspond to a noise state, determining if the byte is valid, and if the byte is not valid, then redesignating the state of said byte to a noise state.

In another aspect of the device, the device also comprises a lookup table of valid bytes, wherein said determination if a byte is valid is accomplished by accessing said lookup table.

Disclosed is a method of validating a byte sequence having a plurality of states including an ASCII state, the method comprising selecting the ASCII state as the noise state generating a most probable state sequence for the byte sequence by a method comprising: calculating $P(X_0 \ldots X_n | S_0 \ldots S_n)$, representing the conditional probabilities of said byte sequence given a state sequence, wherein said calculating $P(X_0 \ldots X_n | S_0 \ldots S_n)$ comprises assigning a state label $S_i$ to each $i^{th}$ byte $X_i$ of the byte sequence so as to maximize the equation:

$$P(X_0 \ldots X_N | S_0 \ldots S_N) = P_0(S_0) \left[ \prod_{i=1}^{N} \overline{A}(S_i | S_{i-1}) \right] \left[ \prod_{i=0}^{N} \overline{B}(X_i | S_i) \right]$$

wherein $P_0(S_0)$ is the initial distribution of states; $\overline{A}(S_i|S_{i-1})$ is a "state-to-state" transition matrix; and $\overline{B}(X_i|S_i)$ is a "byte-from-state" matrix of the probabilities of generating a byte value $X_i$ given a state $S_i$; and utilizing said state sequence to identify all noise in the byte sequence, localizing said noise in said noise states, and deleting said noise from the byte sequence.

DETAILED DESCRIPTION OF THE PREFERRED EMBODIMENTS

Figure 1:
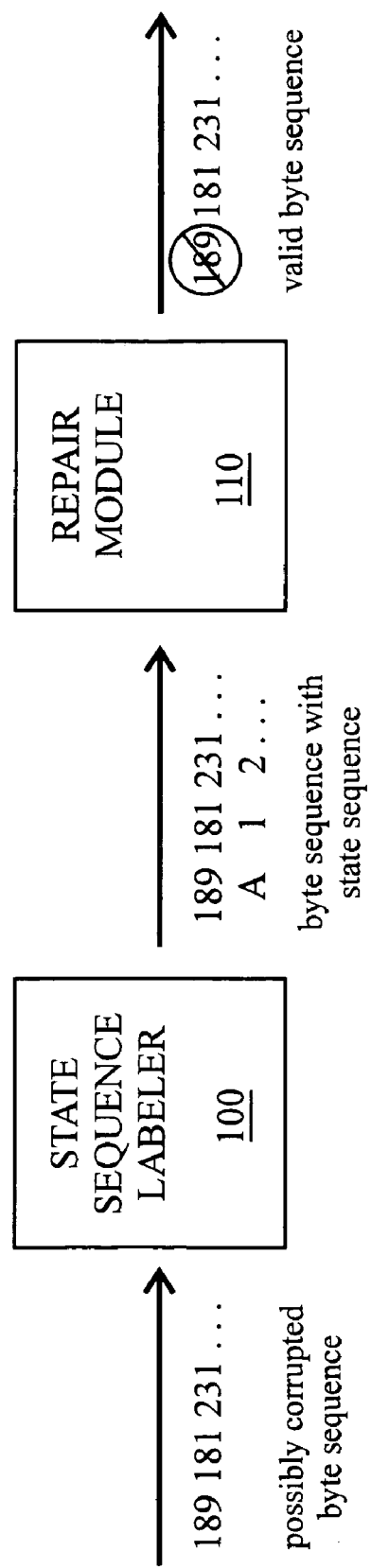
FIG. 1 is a diagram of the overall process of an embodiment of the invention.

Referring to FIG. 1 there is depicted the basic flow of the invention wherein a possibly corrupted byte sequence is passed to a state sequence labeler 100 that first generates a most probable state sequence to the byte sequence and then modifies the state sequence so as to localize all of the errors, or "noise", into a single state. The byte sequence and the associated state sequence are then passed to a repair module 110 that examines the sequences to determine if there exists any errors in the byte sequence and, if so, corrects them, thereby outputting a valid byte sequence.

Figure 2:
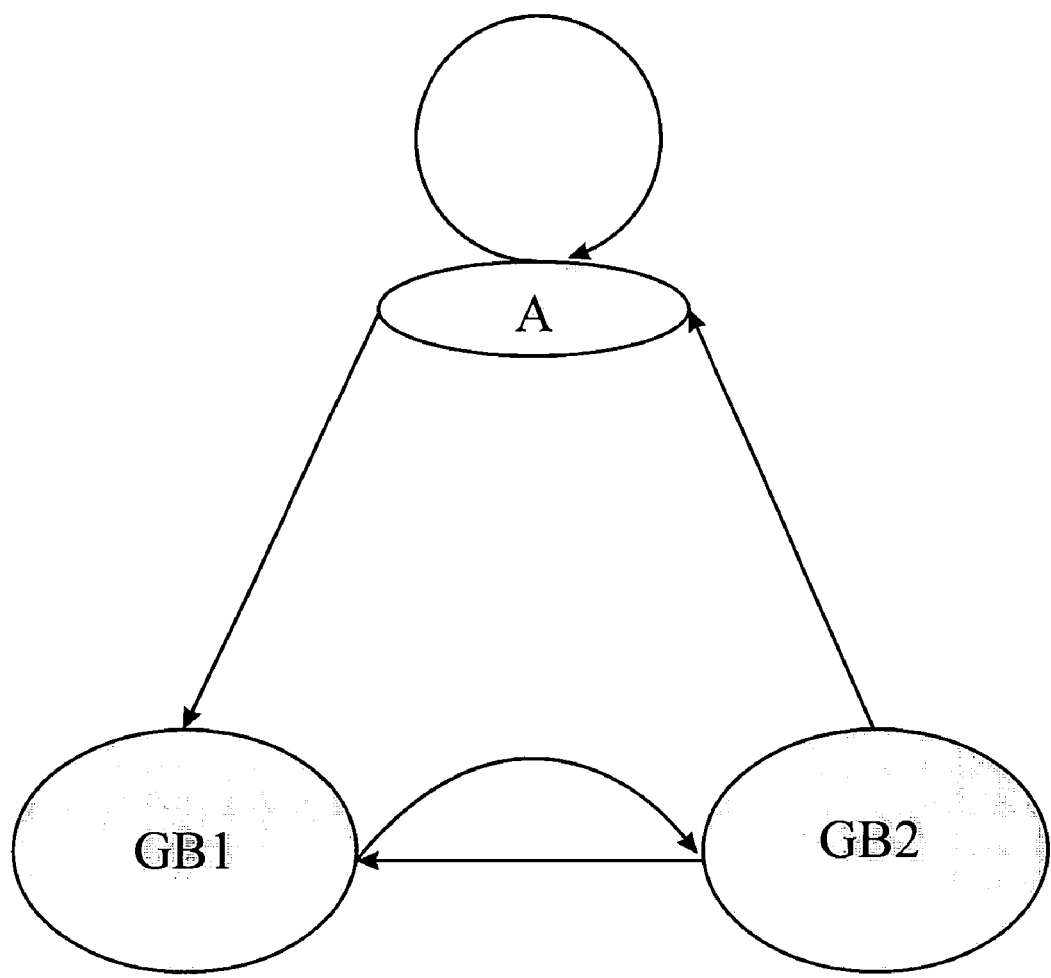
FIG. 2 is a diagram of a typical Markov Model of the invention.

FIG. 2 depicts a typical Markov model for allowable state sequences for mixed double-byte and ASCII sequences, such as GB-type byte sequences. The state of a byte in this example can be one of three, namely an ASCII character (state A), a first byte of a two-byte character state (state GB1), or a second byte of a two-byte character state (state GB2). The states are designated by the user, dependent upon the noise he wishes to detect, which in this example is invalid character codes. As can be seen in the diagram, a single-byte ASCII character (state A) can be followed by another ASCII character (state A) or by the first byte (state GB1) of a double-byte GB-type character, but never can an ASCII character (state A) be followed by the second byte (state GB2) of a double-byte GB-type character. This is shown by the directions of the arrows leading toward and away from the ASCII state A. Likewise, a first GB byte (state GB1) may be followed by a second byte (state GB2), but never by an ASCII character (state A); and a second byte (state GB2) may be followed by an ASCII character (state A), or by a first byte (state GB1), but never by a second byte (state GB2). A violation of these rules is not permitted in the state string generated by the state sequence labeler 100 of FIG. 1 and this is mathematically guaranteed by the zero entries in the "state-to-state" transition matrix $\overline{A}(S_i|S_{i-1})$ of Equation 4c, more fully described below.

Mathematically forcing a proper state sequence upon a corrupted byte sequence with the state-to-state matrix will result in invalid character codes, that is to say that there will be bytes labeled as ASCII state that don't correspond to any valid ASCII character and pairs of GB1 and GB2 bytes that don't correspond to any valid two-byte character. These invalid characters are detected and repaired by the repair module 110. As will be explained below, the repair module does this by "localizing" the invalid characters to one or more designated "noise states."

The method utilized by the state sequence labeler to generate a state sequence for a particular byte sequence makes use of a probabilistic model. For any byte sequence:

$$X_0, X_1, X_2 \ldots X_n \quad (1)$$

we wish to generate a corresponding state sequence:

$$S_0, S_1, S_2, \ldots S_n \quad (2)$$

where each $X_i$ is an integer from 0 to 255 (for eight-bit bytes) and each $S_i$ is either A, 1, or 2 for single-byte ASCII bytes, first double-byte bytes, or second double-byte bytes, respectively.

We may then model the conditional probabilities of the byte sequence of Equation 1 given the state sequence of Equation 2 as:

$$P(X_0 \ldots X_N | S_0 \ldots S_N) = P_0(S_0) \left[ \prod_{i=1}^{N} \overline{A}(S_i | S_{i-1}) \right] \left[ \prod_{i=0}^{N} \overline{B}(X_i | S_i) \right] \quad (3)$$

where $P_0(S_0)$ is the initial distribution of states, namely $P_0(A)=P_0(1)=P_0(2)=\frac{1}{3}$; $\overline{A}(S_i|S_{i-1})$ is the state-to-state transition matrix and will have the properties of the Markov model being utilized; $\overline{B}(X_i|S_i)$ is the "byte-from-state" matrix of the probabilities of generating a byte value $X_i$ given a state $S_i$.

For any byte sequence having σ total states, the state-to-state matrix will be a σ×σ sized matrix:

$$\overline{A}(S_i | S_{i-1}) = \begin{bmatrix} p(S_{i-1}^1 \to S_i^1) & \cdots & p(S_{i-1}^1 \to S_i^\sigma) \\ \vdots & \ddots & \vdots \\ p(S_{i-1}^\sigma \to S_i^1) & \cdots & p(S_{i-1}^\sigma \to S_i^\sigma) \end{bmatrix} \quad (4a)$$

The state-to-state matrix will have the following form in the case of the three-state Markov model shown in FIG. 2:

$$\overline{A}(S_i | S_{i-1}) = \begin{bmatrix} p(A \to A) & p(A \to GB1) & p(A \to GB2) \\ p(GB1 \to A) & p(GB1 \to GB1) & p(GB1 \to GB2) \\ p(GB2 \to A) & p(GB2 \to GB1) & p(GB2 \to GB2) \end{bmatrix} \quad (4b)$$

where $p(S_{i-1} \to S_i)$ indicates the probability, or observed frequency, that a particular $S_i$ state for the $i^{th}$ byte immediately follows a particular $S_{i-1}$ state for the immediately proceeding byte (i−1) in a valid byte sequence. It is to be understood that Equation 4b is the matrix for a three-state byte sequence. When applied to the GB 2312-80 character set, the state-to-state matrix is found to be as follows:

$$\overline{A}(S_i | S_{i-1}) = \begin{bmatrix} 0.995157 & 0.004843 & 0 \\ 0 & 0 & 1 \\ 0.037944 & 0.962056 & 0 \end{bmatrix} \quad (4c)$$

The significance of the matrix entries of FIG. 4b may also be illustrated by the following table:

TABLE 1

|  | $S_i$ = A | $S_i$ = GB1 | $S_i$ = GB2 |
| --- | --- | --- | --- |
| $S_{i-1}$ = A | 0.995157 | 0.004843 | 0 |
| $S_{i-1}$ = GB1 | 0 | 0 | 1 |
| $S_{i-1}$ = GB2 | 0.037944 | 0.962056 | 0 |

From Table 1 we see, for example, that the probability of an ASCII character (i.e., state A) being followed by another ASCII is p(A→A)=0.995157, while the probability of an ASCII being followed by the first byte of a two-byte character is only p(A →GB1)=0.004843. The numbers in Table 1 represent what the probabilities should be for valid text, and are derived from compiling statistics of actual valid text.

The $\overline{B}(X_i|S_i)$ matrix is described by:

$$\overline{B}(X_i \mid S_i) = \begin{bmatrix} h_1(X_i = 1) & \cdots & h_s(X_i = 1) & \cdots & h_\sigma(X_i = 1) \\ \vdots & \ddots & \vdots & & \vdots \\ h_1(X_i = x_1) & & h_s(X_i = x_1) & & h_\sigma(X_i = x_1) \\ h_1(X_i = x_1 + 1) & & \varepsilon_1(X_i = x_1 + 1) & & h_\sigma(X_i = x_1 + 1) \\ \vdots & & \vdots & & \vdots \\ h_1(X_i = x_r) & & \varepsilon_1(X_i = x_r) & & h_\sigma(X_i = x_r) \\ h_1(X_i = x_r + 1) & & \varepsilon_r(X_i = x_r + 1) & & h_\sigma(X_i = x_r) \\ \vdots & & \vdots & \ddots & \vdots \\ h_1(X_i = x_r = 255) & & \varepsilon_r(X_i = x_r = 255) & & h_\sigma(X_i = 255) \end{bmatrix} \quad (5a)$$

where $h_s(X_i)$ are histogram functions of the states and $\varepsilon_j(X_i)$ are probabilities of associating noise with the $s^{th}$ state within $r+1$ $X_i$ ranges. This indicates that the $s^{th}$ state has been selected as the "noise state" in accordance with the invention as is more fully described below.

For the three-state Markov model of FIG. 2, Equation 5a becomes:

$$\overline{B}(X_i \mid S_i) = \begin{bmatrix} h_A(X_i = 1) & 0 & 0 \\ \vdots & \vdots & \vdots \\ h_A(X_i = 127) & 0 & 0 \\ \varepsilon_1(X_i = 128) & 0 & 0 \\ \vdots & \vdots & \vdots \\ \varepsilon_1(X_i = 160) & 0 & 0 \\ \varepsilon_2(X_i = 161) & h_1(X_i = 161) & h_2(X_i = 161) \\ \vdots & \vdots & \vdots \\ \varepsilon_2(X_i = 254) & h_1(X_i = 254) & h_2(X_i = 254) \\ \varepsilon_3(X_i = 255) & 0 & 0 \end{bmatrix} \quad (5b)$$

where $h_A(X_i)$ is computed by sampling valid ASCII text, computing the histogram of its bytes, and then normalizing them so that the entire column of the matrix (including the epsilon's) sums to 1. First-byte histogram $h_1(X_i)$ is computed by sampling valid two-byte text and computing the histogram over the odd bytes, while the second-byte histogram $h_2(X_i)$ is computed over the even bytes. Histograms $h_1(X_i)$ and $h_2(X_i)$ are also then normalized to cause their respective columns to sum to 1. Notice that the above matrix implies that the ASCII state is the designated noise state.

The significance of the $\overline{B}(X_i|S_i)$ matrix entries with respect to GB 2312-80 is described by the following table:

TABLE 2

| | $S_i = A$ | $S_i = GB1$ | $S_i = GB2$ |
|---|---|---|---|
| $0 \leq X_i \leq 127$ | $h_A(X_i)$ | 0 | 0 |
| $128 \leq X_i \leq 160$ | $\varepsilon_1(X_i)$ | 0 | 0 |
| $161 \leq X_i \leq 254$ | $\varepsilon_2(X_i)$ | $h_1(X_i)$ | $h_2(X_i)$ |
| $X_i = 255$ | $\varepsilon_3(255)$ | 0 | 0 | where it can be seen, for example, that bytes associated with GB 2312-80 Chinese characters (i.e., $161 \leq X_i \leq 254$) are most likely to have been generated by states GB1 and GB2, but have a small error probability, $\varepsilon_2$, of deriving from an ASCII character.

To generate the state sequence for a given string of characters, Equation 3 is used to find the state sequence that maximizes the value of $P(X_0 \ldots X_n | S_0 \ldots S_n)$. Then, all pairs of bytes labeled GB1 followed by GB2 are analyzed to confirm that they are valid GB characters (the GB 2312-80 character set contains some "gaps" within the valid range of bytes, so a preferred embodiment for such "gapped" character sets is to do this checking by looking up the values in a lookup table.) If they do not form a valid character both bytes are relabeled as the noise state, in this example as ASCII, in the state sequence.

The state sequence that results from the above operations is passed on to the repair module 110 and has the following properties:

TABLE 3

1. Any consecutive states GB1 and GB2 are guaranteed to correspond to valid two-byte characters.
2. Any ASCII state A whose value $X_i$ is $0 \leq X_i \leq 127$ is valid.
3. Any state A whose value $X_i$ is not $0 \leq X_i \leq 127$ may be regarded as invalid where it can be seen that all of the noise is now localized into one state, namely the ASCII state. This is by way of illustration only, because we may modify the procedure of the sequence labeler 100 so as to localize all of the noise into one of the other states.

The repair module 110 simply identifies invalid ASCII characters in the sequence and deletes them. In another embodiment, the repair module 110 may also detect ambiguities in the string and make corrections by accessing a database of statistics of actual language samples.

Though we have described the invention with respect to the GB 2312-80 Chinese character set and with only three states and localized all the noise into the ASCII state, the invention is generalizable to any character set having a states, where a $\sigma > 1$. Nor is the invention limited to character states having one and two-byte characters, but is generalizable to any combination of characters of any number of bytes. The fundamental procedure is to utilize a probabilistic model to localize all the error into a one or more designated noise states. Also, a state that represents forbidden transitions in byte values may always be added to the model and may also be used as a designated noise state. Hence, the invention may easily be generalized to all multibyte text and will be found useful as a filter for all manner of character converters and text translators, editors, search engines, and the like.

Further, it may be pointed out that more than one state may be designated as noise states and error assigned to each according to a set of rules. This is useful if one wishes to segregate different types of noise. Nor must the noise states correspond to actual valid states, but rather may be designated as separate individual states on their own.

The method of the invention may be executed as a program of instructions tangibly embodied upon a storage device readable by machine, such as a computer.

As an example of the workings of the invention, consider the following GB 2312-80 byte sequence where each two-byte sequence is shown with the Chinese letter it represents:

| Byte Sequence | 181 | 231 | 202 | 211 | 189 | 218 | 196 | 191 |
|---|---|---|---|---|---|---|---|---|
| Character | 电 | | 视 | | 节 | | 目 | |

Now consider the case where the sequence is corrupted by a stray byte value, decimal 189, inserted at the beginning:

| Byte Sequence | 189 | 181 | 231 | 202 | 211 | 189 | 218 | 196 | 191 |
|---|---|---|---|---|---|---|---|---|---|
| Character | | 降 | | 缁 | | 咏 | | 诶 | |

Current technology is incapable of determining whether the above sequence is valid or not, but a native speaker of Chinese would instantly recognized the corrupted sequence as gibberish. According to the invention, the corrupted byte string is passed to the state sequence labeler 100 of FIG. 1 where a corresponding state sequence is constructed according to Equations 1 through 5:

| Byte Sequence | 189 | 181 | 231 | 202 | 211 | 189 | 218 | 196 | 191 |
|---|---|---|---|---|---|---|---|---|---|
| State Sequence | A | GB1 | GB2 | GB1 | GB2 | GB1 | GB2 | GB1 | GB2 |
| Character | | 降 | | 缁 | | 咏 | | 诶 | |

The suspected byte sequence and the corresponding state sequence are passed to the repair module 110 where, assuming we have chosen to localize the noise to the ASCII state, the non-ASCII states are examined to test if they are within valid numeric ranges. Any found not to be are relabeled as ASCII. The ASCII states are then examined and any ASCII states not within acceptable byte values are considered invalid All the non-ASCII in our example are valid, however, so it only remains for the repair module 110 to move to the last step and flag or delete the invalid ASCII characters:

| Byte Sequence | 189 | 181 | 231 | 202 | 211 | 189 | 218 | 196 | 191 |
|---|---|---|---|---|---|---|---|---|---|
| Character | (flag/delete) | 电 | | 视 | | 节 | | 目 | | thereby recovering the correct sequence.

Of course, though we have depicted separate state sequence labelers 100 and repair modules 110, thesis is for illustrative and clarification purposes only. The functionality of the modules may be integrated together or conversely, further subdivided as desired by the practitioner of the invention.

It should be noted that the "states" of a byte sequence are ambiguous and therefore within the control of the user of the invention. The states selected for the method of the invention are dependent upon the noise one wishes to eliminate. In the above example, we used a three state Markov model with the ASCII state designated as the noise state. This is sufficient where the only noise we are interested in is invalid bytes, but we could expand the Markov model to find other noise. For example, additional states for punctuation, consonants, vowels, capitalized letters, and the like may be added to monitor other forms of corruption.

One may even use a Markov model that analyzes two or more bytes at a time, rather than one at a time. Hence the byte-from-state matrix $\overline{B}(X_i|S_i)$ would enlarge to $256^2 \times \#$ states with the definition of the states slightly modified. Such a model would pick out impermissible byte pairs (e.g., in an English version of the model, the letter q followed by anything other that a "u" could be picked out as noise, or any consonant not properly followed by a vowel).

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method of validating a byte sequence, the method comprising:
   defining a plurality of states for the byte sequence;

designating one or more noise states from among the plurality of states;

generating a most probable state sequence for the byte sequence;

utilizing said most probable state sequence to identify all noise in the byte sequence; and localizing said noise in said noise states.

2. The method of claim 1 further comprising deleting said noise from the byte sequence.

3. The method of claim 1 wherein an ASCII state is also designated as a noise state.

4. The method of claim 1 wherein said generating of a most probable state sequence comprises calculating $P(X_0 \ldots X_n | S_0 \ldots S_n)$, representing the conditional probabilities of said byte sequence $X_0 \ldots X_n$ given a state sequence $S_0 \ldots S_n$.

5. The method of claim 4 wherein said calculating $P(X_0 \ldots X_n | S_0 \ldots S_n)$ comprises assigning a state label $S_i$ to each $i^{th}$ byte $X_i$ of the byte sequence so as to maximize the equation:

$$P(X_0 \ldots X_N | S_0 \ldots S_N) = P_0(S_0) \left[ \prod_{i=1}^{N} \overline{A}(S_i | S_{i-1}) \right] \left[ \prod_{i=0}^{N} \overline{B}(X_i | S_i) \right]$$

wherein $P_0(S_0)$ is the initial distribution of states; $\overline{A}(S_i | S_{i-1})$ is a "state-to-state" transition matrix; and $\overline{B}(X_i | S_i)$ is a "byte-from-state" matrix of the probabilities of generating a byte value $X_i$ given a state $S_i$.

6. The method of claim 5, wherein:

$$\overline{A}(S_i | S_{i-1}) = \begin{bmatrix} p(S_{i-1}^1 \to S_i^1) & \cdots & p(S_{i-1}^1 \to S_i^\sigma) \\ \vdots & \ddots & \vdots \\ p(S_{i-1}^\sigma \to S_i^1) & \cdots & p(S_{i-1}^\sigma \to S_i^\sigma) \end{bmatrix}$$

where each $p(S_{i-1} \to S_i)$ is the probability that a particular $S_i$ state immediately follows an $S_{i-1}$ state in a valid byte sequence having $\sigma$ total states.

7. The method of claim 6, wherein:

$$\overline{A}(S_i | S_{i-1}) = \begin{bmatrix} p(A \to A) & p(A \to GB1) & p(A \to GB2) \\ p(GB1 \to A) & p(GB1 \to GB1) & p(GB1 \to GB2) \\ p(GB2 \to A) & p(GB2 \to GB1) & p(GB2 \to GB2) \end{bmatrix}$$

where each $p(S_{i-1} \to S_i)$ is the probability that a particular $S_i$ state immediately follows an $S_{i-1}$ state in a valid byte sequence having three states.

8. The method of claim 7, wherein:

$$\overline{A}(S_i | S_{i-1}) = \begin{bmatrix} 0.995157 & 0.004843 & 0 \\ 0 & 0 & 1 \\ 0.037944 & 0.962056 & 0 \end{bmatrix}$$

and said valid byte sequence is valid text in the GB 2312-80 character set.

9. The method of claim 5, wherein:

$$\overline{B}(X_i | S_i) = \begin{bmatrix} h_1(X_i = 1) & \cdots & h_s(X_i = 1) & \cdots & h_\sigma(X_i = 1) \\ \vdots & \ddots & \vdots & & \vdots \\ h_1(X_i = x_1) & & h_s(X_i = x_1) & & h_\sigma(X_i = x_1) \\ h_1(X_i = x_1 + 1) & & \epsilon_1(X_i = x_1 + 1) & & h_\sigma(X_i = x_1 + 1) \\ \vdots & & \vdots & & \vdots \\ h_1(X_i = x_r) & & \epsilon_1(X_i = x_r) & & h_\sigma(X_i = x_r) \\ h_1(X_i = x_r + 1) & & \epsilon_r(X_i = x_r + 1) & & h_\sigma(X_i = x_r) \\ \vdots & & \vdots & \ddots & \vdots \\ h_1(X_i = x_r = 255) & & \epsilon_r(X_i = x_r = 255) & & h_\sigma(X_i = 255) \end{bmatrix}$$

where $h_s(X_i)$ are histogram functions of the $\sigma$ states and $\epsilon_j(X_i)$ are probabilities of associating noise with the noise state for bytes within $r+1$ ranges of byte values $X_i$.

10. The method of claim 9, wherein:

$$\overline{B}(X_i | S_i) = \begin{bmatrix} h_A(X_i = 1) & 0 & 0 \\ \vdots & \vdots & \vdots \\ h_A(X_i = 127) & 0 & 0 \\ \epsilon_1(X_i = 128) & 0 & 0 \\ \vdots & \vdots & \vdots \\ \epsilon_1(X_i = 160) & 0 & 0 \\ \epsilon_2(X_i = 161) & h_1(X_i = 161) & h_2(X_i = 161) \\ \vdots & \vdots & \vdots \\ \epsilon_2(X_i = 254) & h_1(X_i = 254) & h_2(X_i = 254) \\ \epsilon_3(X_i = 255) & 0 & 0 \end{bmatrix}$$

where $h_s(X_i)$ are histogram functions of the states, and $\epsilon_j(X_i)$ are probabilities of associating noise with the ASCII state within a plurality of $X_i$ ranges for a three-state byte sequence.

11. The method of claim 10 further comprising:

providing a valid three-state byte sequence having an ASCII state and comprising valid ASCII and two-byte characters;

computing an ASCII histogram $h_A(X_i)$ by a method comprising:

sampling valid ASCII text so as to measure the frequency of occurrence of each byte value;

computing an unnormalized ASCII histogram of said sampling over the ASCII range of $X_i$; and normalizing said unnormalized ASCII histogram such that the entire column of the matrix containing said ASCII histogram sums to 1;

computing a first-byte histogram $h_1(X_i)$ by sampling valid two-byte text and computing the unnormalized first-byte histogram over the odd bytes, and normalizing said first-byte histogram such that the entire column of the matrix containing said first-byte histogram sums to 1; and computing a second-byte histogram $h_2(X_i)$ by sampling valid two-byte text and computing the unnormalized second-byte histogram over the odd bytes, and normalizing said second-byte histogram such that the entire column of the matrix containing said second-byte histogram sums to 1.

12. A program storage device readable by machine, tangibly embodying a program of instructions executable by the machine to perform method steps for validating a byte sequence, said method comprising:

defining a plurality of states for the byte sequence;

designating one or more noise states from among the plurality of states;

generating a most probable state sequence for the byte sequence;

utilizing said state sequence to identify all noise in the byte sequence; and localizing said noise in said noise states.

13. The device of claim 12 wherein said localizing of said noise in said noise states comprises:

examining each byte in said byte sequence that does not correspond to a noise state;

determining if the byte is valid; and if the byte is not valid, then redesignating the state of said byte to a noise state.

14. The device of claim 13 further comprising:

a lookup table of valid bytes; and wherein said determination if a byte is valid is accomplished by accessing said lookup table.

15. A method of validating a byte sequence, the method comprising:

defining a plurality of states for the byte sequence, including at least one ASCII state;

designating at least one ASCII state as a noise state;

generating a most probable state sequence for the byte sequence by a method comprising:

calculating $P(X_0 \ldots X_n | S_0 \ldots S_n)$, representing the conditional probabilities of said byte sequence given a state sequence;

wherein said calculating $P(X_0 \ldots X_n | S_0 \ldots S_n)$ comprises assigning a state label $S_i$ to each $i^{th}$ byte $X_i$ of the byte sequence so as to maximize the equation:

$$P(X_0 \ldots X_N | S_0 \ldots S_N) = P_0(S_0)\left[\prod_{i=1}^{N} \overline{A}(S_i | S_{i-1})\right]\left[\prod_{i=0}^{N} \overline{B}(X_i | S_i)\right]$$

wherein $P_0(S_0)$ is the initial distribution of states; $\overline{A}(S_i|S_{i-1})$ is a "state-to-state" transition matrix; and $\overline{B}(X_i|S_i)$ is a "byte-from-state" matrix of the probabilities of generating a byte value $X_i$ given a state $S_1$;

utilizing said state sequence to identify all noise in the byte sequence;

localizing said noise in said noise states; and deleting said noise from the byte sequence.

* * * * *